(12) United States Patent
Multari et al.

(10) Patent No.: US 11,719,727 B1
(45) Date of Patent: Aug. 8, 2023

(54) SYSTEMS AND METHODS FOR SCREENING PARTICLE SOURCE MANUFACTURING AND DEVELOPMENT TEST DATA

(71) Applicant: National Technology & Engineering Solutions of Sandia, LLC, Albuquerque, NM (US)

(72) Inventors: Rosalie A. Multari, Albuquerque, NM (US); Jaideep Ray, Tracy, CA (US); Lisa Michelle Miller, Rio Rancho, NM (US); Paul Girard Cummings, Jr., Albuquerque, NM (US); Robert Ferrizz, Albuquerque, NM (US); Lisa A. Walla, Albuquerque, NM (US); Nishant Bhupendra Patel, Albuquerque, NM (US); Shawn Martin, Sandia Park, NM (US); Curtis Co, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 251 days.

(21) Appl. No.: 17/172,353

(22) Filed: Feb. 10, 2021

Related U.S. Application Data

(60) Provisional application No. 62/972,209, filed on Feb. 10, 2020.

(51) Int. Cl.
*G01R 19/00* (2006.01)
*G06N 20/00* (2019.01)

(52) U.S. Cl.
CPC ......... *G01R 19/0061* (2013.01); *G06N 20/00* (2019.01)

(58) Field of Classification Search
CPC ............................ G01R 19/0061; G06N 20/00
See application file for complete search history.

(56) References Cited

U.S. PATENT DOCUMENTS 8,591,108 B2  11/2013 Tada
8,655,807 B2   2/2014 Multari et al.
(Continued)

FOREIGN PATENT DOCUMENTS

CN        108564104 A    9/2018

OTHER PUBLICATIONS

Multari, et al., "Proof of Principle for a Real-Time Pathogen Isolation Media Diagnostic: The Use of Laser-Induced Breakdown Spectroscopy to Discriminate Bacterial Pathogens and Antimicrobial-Resistant *Staphylococcus aureus* Strains Grown on Blood Agar", In Journal of Pathogens, vol. 2013, 2013, 11 Pages.
(Continued)

*Primary Examiner* — Roy Y Yi
*Assistant Examiner* — Geoffrey T Evans
(74) *Attorney, Agent, or Firm* — Samantha Updegraff; Medley, Behrens & Lewis, LLC

(57) ABSTRACT

A computing system obtains test data for a particle source. The test data was generated by the particle source when the particle source was caused to emit particles. The test data comprises a first set of measurements of a first type and a second set of measurements of a second type. The computing system applies a data agnostic predictive model to the test data. The data agnostic predictive model is generated without a parametric analysis of variables of the first type and variables of the second type. The data agnostic predictive model outputs, based upon the test data, a value that is indicative of whether or not the test data is abnormal. Based
(Continued)

upon the value, the computing system outputs an indication that the particle source was operating sub-optimally when emitting the particles.

20 Claims, 5 Drawing Sheets

(56) References Cited

U.S. PATENT DOCUMENTS

| | | |
|---|---|---|
| 9,646,732 B2 | 5/2017 | Adler et al. |
| 2014/0368819 A1 | 12/2014 | Multari et al. |
| 2019/0206655 A1* | 7/2019 | Tromp ................ H01J 37/292 |

OTHER PUBLICATIONS

Multari, et al., "The use of laser-induced breakdown spectroscopy for the differentiation of pathogens and viruses on substrates", In Applied Optics, vol. 51, No. 7, 2012, 22 Pages.

Multari, et al., "The Use of Laser-Induced Breakdown Spectroscopy for Distinguishing Between Bacterial Pathogen Species and Strains", In Applied Spectroscopy, vol. 64, No. 7, 2010, pp. 750-759.

Multari, et al., "Detection of Pesticides and Dioxins in Tissue Fats and Rendering Oils Using Laser-Induced Breakdown Spectroscopy (LIBS)", Journal of Agricultural and Food Chemistry, Jan. 18, 2013, 61:2348-2357.

Multari, et al., "Detection of Biological Contaminants on Food and Food Surfaces Using Laser-Induced Breakdown Spectroscopy (LIBS)", Journal of Agricultural and Food Chemistry, Apr. 13, 2013, 61:8687-8694.

* cited by examiner

US 11,719,727 B1

SYSTEMS AND METHODS FOR SCREENING PARTICLE SOURCE MANUFACTURING AND DEVELOPMENT TEST DATA

RELATED APPLICATION

This application claims priority to U.S. Provisional Patent Application No. 62/972,209, filed on Feb. 10, 2020, and entitled "SYSTEMS AND METHODS FOR SCREENING PARTICLE SOURCE MANUFACTURING AND DEVELOPMENT TEST DATA", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

A particle source is a device that is capable of generating particles. Example particle sources and their corresponding particles include electron sources that generate electrons, photon sources that generate photons, neutron sources that generate neutrons, and x-ray sources that generate x-ray particles. Particle sources are used in a variety of devices such as electron microscopes, x-ray equipment (e.g., x-ray spectroscopy equipment), electron-beam lithography equipment, auger spectroscopy equipment, lasers, etc.

Testing a particle source (or components comprised by the particle source) before, during, and/or after manufacture is important to ensure that the particle source is functioning correctly. Testing a particle source typically involves an analysis of a variety of time-series data (e.g., voltages, electrical currents, fluxes, etc.) associated with the particle source as the particle source emits particles. Conventionally, a human performs a manual analysis of the time-series data in order to determine whether the particle source is operating sub-optimally. Such manual analysis typically entails a visual review of plotted data and/or tabular data by the human to determine if such data is abnormal and hence indicative of sub-optimal operation of the particle source. Manual analysis tends to lead to non-uniform decisions as to which particle sources are defective, as different humans may make different decisions given the same data.

SUMMARY

The following is a brief summary of subject matter that is described in greater detail herein. This summary is not intended to be limiting as to the scope of the claims.

Disclosed herein are various technologies pertaining to analyzing test data of a particle source as the particle source is caused to emit particles. With more specificity, a computing system is disclosed herein that is configured to detect, based upon the aforementioned test data, that the test data of the particle source is abnormal. The computing system is also configured to identify a sub-optimal behavior exhibited by the particle source when the computing system detects that the test data is abnormal. To accomplish the identification of the sub-optimal behavior, the computing system utilizes a data-agnostic predictive model that is developed without a parametric analysis of variables of different types in the test data. The computing system may be used in a manufacturing process of the particle source in order to identify and eliminate particle sources that exhibit sub-optimal behavior while operating and/or improve a design of the particle source(s).

In operation, the computing system obtains training data for particle sources that were associated with the particles sources as the particles sources were caused to emit particles. In an example, the particle sources may be neutron sources, and as such the particles may be neutrons. With more specificity, as a particle source in the particle sources is caused to emit particles, different sensors may collect various measurements of parameters (e.g., voltage, electrical current, particle count, etc.) associated with the particle source over time. For instance, a voltmeter may detect a voltage input to the particle source as the particle source emits the particles (i.e., voltage time-series data) and an ammeter may detect an electrical current used to drive the particle source as the particle source emits the particles (i.e., electrical current time-series data). The time-series data referenced above, as well as (optionally) other data pertaining to the particle source, is included in training data that is employed to train a computer-implemented model that can be employed to identify whether a particle source is operating sub-optimally. The training data is labeled—for instance, training data associated with a first particle source that exhibited normal behavior when emitting particles may be labeled as "normal," while training data associated with a second particle source that exhibited sub-optimal behavior may be labeled as "sub-optimal," along with an identifier for the sub-optimal behavior. The computing system generates a composite data structure based upon the training data associated with particle sources.

In an exemplary embodiment, a computing system performs multivariate analysis in connection with analyzing the training data to learn a computer-implemented model. In the embodiment, the computing system generates a 1×N array (i.e., a composite data structure) based upon the training data, where N is a sum of a number of measurements in the training data. Each entry in the 1×N array is a measurement generated by a sensor. The 1×N array serves as a "signature" for a particle source. In the embodiment, the computing system repeats this process for each particle source represented in the training data to generate a composite data structure for each particle source.

In another embodiment, the computing system performs wavelet analysis to analyze the training data in connection with learning the computer-implemented model. In the embodiment, the computing system generates a P×R array (i.e., a composite data structure) based upon the training data, where P is a number of timesteps and R is a number of sensors. Thus, an entry in the P×R array is indicative of a measurement generated by one of the sensors at a given timestep. In the embodiment, the computing system repeats this process for each particle source represented in the training data to generate a composite data structure for each particle source.

The computing system then generates (i.e., trains) a data agnostic predictive model based upon the composite data structures generated for the particle sources represented in the training data. The computing system generates the data agnostic predictive model without a parametric analysis of types of variables included in the training data. With more specificity, the computing system may generate the data agnostic predictive model without analyzing for specific parameters or comparing measurements of a type to threshold values of the type. After generation of the data agnostic predictive model, the computing system may test the data agnostic predictive model on testing data not included in the training data to evaluate performance of the model. If the data agnostic predictive model meets a performance threshold goal (e.g., 99% successful identification of a type of sub-optimal behavior), the computing system may include the data agnostic predictive model in an automated system for detecting defects when particles sources are being tested. If the data agnostic predictive model does not meet the performance threshold goal, the computing system may iterate the training process to improve performance of the data agnostic predictive model or the computing system may discard the data agnostic predictive model.

In the embodiment referenced above where multivariate analysis is utilized, the data agnostic predictive model may be a regression model. In the embodiment referenced above where wavelet analysis is utilized, the data agnostic predictive model may be a classifier model, such as a Naïve Bayes classifier model or a random forest (RF) classifier model.

Subsequently, the computing system obtains test data for a (to-be-tested) particle source that is associated with the particle source when the particle source was caused to emit particles. Following the example above, the particle source may be a neutron source and the particles may be neutrons. The computing system applies the data agnostic predictive model to the test data. With more specificity, similar to the process described above, the computing system generates a composite data structure (e.g., a 1×N array, a P×R array, etc.) for the test data for the particle source. The computing system provides the composite data structure as input to the data agnostic predictive model. The data agnostic predictive model outputs a value based upon the input, wherein the value is indicative of whether or not the test data is abnormal. Based upon the value, the computing system outputs an indication that the particle source was operating sub-optimally when emitting the particles. For instance, when the value exceeds a threshold value, the computing system may output the indication. The computing system may also output an identifier for a type of sub-optimal behavior (e.g., high voltage breakdown, timing problems, etc.) exhibited by the particle source when the particle source was emitting the particles. In an embodiment, the value and the type of sub-optimal behavior may be included in a report that is presented on a display to a user. In another embodiment, the computing system may cause the particle source to be removed from manufacturing when the test data is abnormal.

In an embodiment, different data agnostic predictive models may be generated using the above-described processes, where each predictive model is configured to identify a different type of sub-optimal behavior of the particle source. For instance, a first data agnostic predictive model may be configured to detect a first type of sub-optimal behavior of the particle source and a second data agnostic predictive model may be configured to detect a second type of sub-optimal behavior of the particle source. In the embodiment, the different data agnostic predictive models may be applied to the test data for the particle source in a pipeline to create a programmed flow for detecting defects in the particle source.

The above-described technologies present various advantages over conventional approaches for analyzing test data for a particle source. First, unlike conventional approaches, the above-described technologies do not require a manual review of the test data in order to determine whether the particle source is functioning properly. Thus, the above-described technologies reduce human engineering resources required to review the test data and enable early detection of trends which would normally be difficult to detect in the manufacturing process for the particle source. The above-described technologies are also useful in prototyping new particle source designs. Second, the above-described technologies do not require a parametric analysis of different types of variables (e.g., electrical current, voltage, etc.) represented in the test data in order to determine whether the particle source test data is abnormal. Thus, the above-described technologies are effective at extracting a signal from the particle source test data even when the signal is not visually discernable. Moreover, as parametric analysis need not be performed, the above-described technologies simplify model development.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
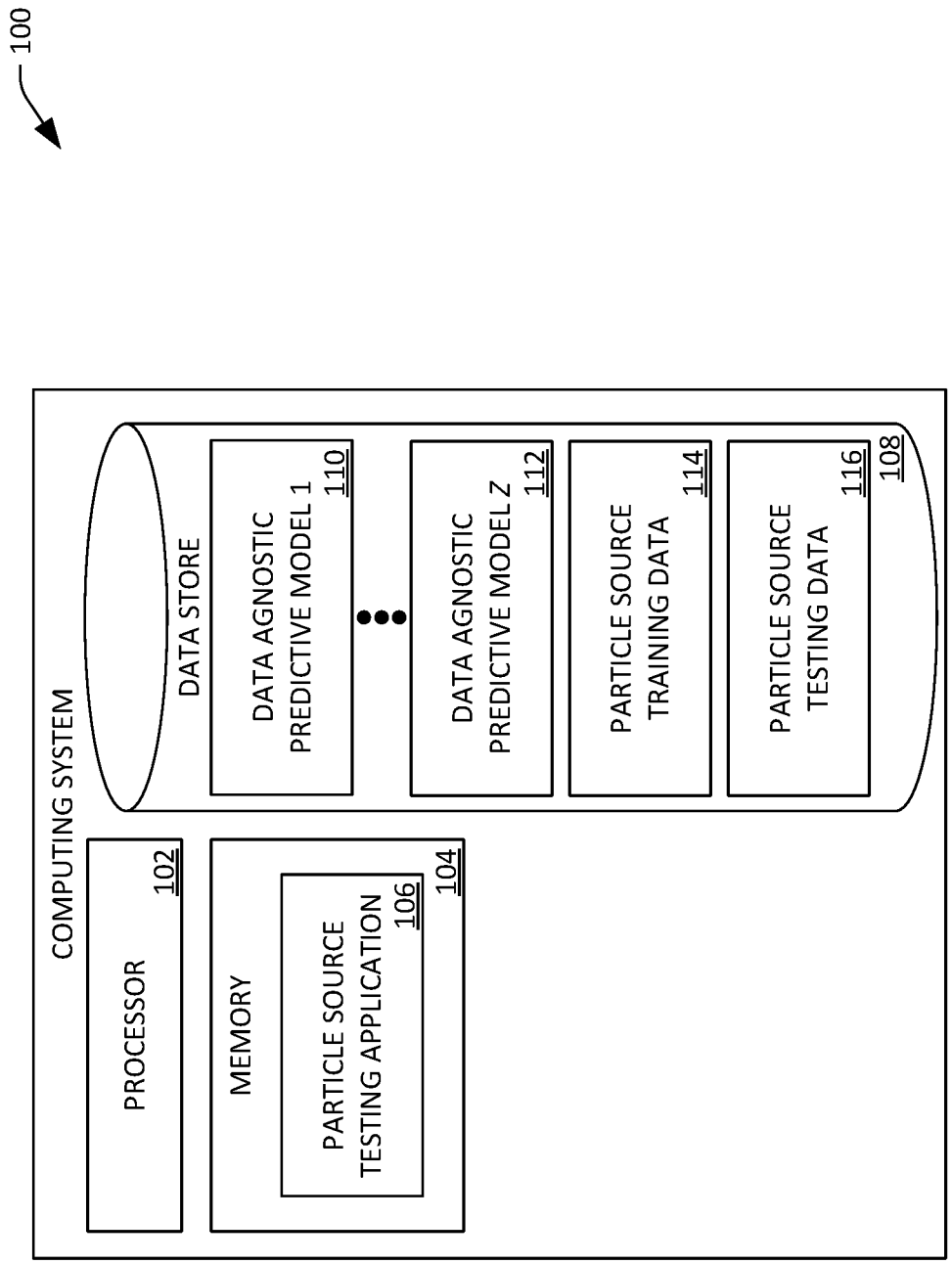
FIG. 1 is a functional block diagram of an exemplary computing system that facilitates analyzing particle source test data.

Various technologies pertaining to screening particle source test data are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Further, as used herein, the term "exemplary" is intended to mean serving as an illustration or example of something, and is not intended to indicate a preference.

With reference to FIG. 1, an exemplary computing system 100 that facilitates analyzing particle source test data of a particle source is illustrated. The computing system 100 includes a processor 102 and memory 104, wherein the memory 104 has a particle source testing application 106 (referred to hereafter as "the testing application 106") loaded therein. As will be described in greater detail below, the testing application 106 is configured to develop data agnostic predictive models that can be used to detect abnormalities in test data generated by a particle source as the particle source emits particles, and hence detect whether or not the particle source is exhibiting suboptimal behavior. In an example, the particle source may be or include an electron source that generate electrons, a photon source that generate photons, a neutron source that generates neutrons, and/or an x-ray source that generate x-ray particles.

The computing system 100 includes a data store 108. The data store 108 stores a first data agnostic predictive model 110. The data store 108 may also store a Zth data agnostic predictive model 112, where Z is a positive integer greater than 1. The first data agnostic predictive model 110 and the Zth data agnostic predictive model 112 are collectively referred to herein as "the plurality of data agnostic predictive models 110-112." Each model in the plurality of data agnostic predictive models 110-112 may be configured to detect a different type of suboptimal behavior exhibited by a particle source. For instance, the first data agnostic predictive model 110 may be configured to detect high voltage breakdown behavior in a particle source, while the Zth data agnostic predictive model 112 may be configured to detect a "choking" defect in the particle source.

In general, the plurality of data agnostic predictive models 110-112 are agnostic to a type and source of data used to develop such models; that is, the plurality of data agnostic predictive models 110-112 are developed without parametric analysis of variables of specific types. Moreover, the plurality of data agnostic predictive models 110-112 enable test data of a particle source to be analyzed for performance without analyzing for specific parameters and/or performance to specific threshold limits. As will be described in greater detail below, the testing application 106 generates composite data structures for test data of particle sources as part of development of the plurality of data agnostic predictive models 110-112. A composite data structure for test data of a particle source includes measurements of parameters associated with the particle source (collected by sensors) as the particle source is caused to emit particles, with no accommodation for types of the measurements.

The data store 108 may include particle source training data 114 from a plurality of particle sources (referred to hereafter as "the training data 114") that is used to train the plurality of data agnostic predictive models 110-112. The training data 114 is associated with the plurality of particle sources as the plurality of particles sources are caused to emit particles. In an example, the training data 114 may include voltage data, electrical current data, particle counts, etc. The training data 114 may be or include time-series data. The data store 108 may also include particle source testing data 116 (referred to hereafter as "the testing data 116") from a second plurality of particle sources. The testing data 116 is similar to the training data 114 (i.e., the testing data 116 may be or include voltage data, electrical current data, and/or particle counts and may be or include time-series data); however, the testing data 116 is used to test performance of the plurality of data agnostic predictive models 110-112, rather than train the plurality of data agnostic predictive models 110-112. The training data 114 and the testing data 116 may be labeled. For instance, training data for a first particle source that exhibited normal behavior may be labeled as "normal," while training data for a second particle source that exhibited sub-optimal behavior may be labeled as "sub-optimal," along with an indication of a type of the sub-optimal behavior.

In an example, the testing application 106 may develop the first data agnostic predictive model 110 using multivariate predictive analysis. Multivariate analysis is strongly data-driven and yields expressive latent structures when the training data 114 is large and diverse. Multivariate analysis postulates that predictors (also referred to as features) can be represented sparsely as the latent structures. The testing application 106 can estimate the latent structures solely from the training data 114. The latent structures can always be computed; however, quality of the latent structures depends on amount and diversity of the training data 114. Key features in the training data 114 contributing to predictions may not be easily correlated to physical phenomena. As such, prediction and data can be analyzed without detailed analysis of specific parameters. Multivariate analysis tends to be sensitive in detecting differences between data groups but tends not to detect a reason for the differences. After the testing application 106 performs the multivariate analysis, the testing application 106 may cause different data agnostic predictive models to be created to differentiate portions of the training data 114. The testing application 106 may combine the different data agnostic predictive models in a logical flow to successfully identify different types of sub-optimal behaviors exhibited by particle sources as the particle sources emit particles.

For multivariate analysis, sensors may collect measurements from a particle source as the particle source is caused to emit particles. The testing application 106 may concatenate the measurements into a 1×N array (i.e., a composite data structure), where N is a sum of a number of measurements obtained from the sensors. Each entry in the 1×N array is a different measurement obtained from one of the sensors. Thus, the testing application 106 constructs a "signature" of the particle source through creation of the 1×N array. In an embodiment, analog sensors may obtain analog measurements, and digitizers may convert the analog measurements to digital measurements, whereupon the digital measurements are included in the 1×N array.

Projection to latent structures (PLS) is a technique that generalizes and combines features from both Principle Component Analysis (PCA) and multivariate regression. PLS is useful when trying to predict a set of dependent variables from a very large set of independent variables. PLS analysis assumes that all measured variance is useful variance to be explained. Latent variables are estimated as exact linear combinations of observed measurements to create an exact definition of component scores. Through an iterative estimation technique, a general model is developed that encompasses canonical correlation, redundancy analysis, multiple regression, multivariate analysis of variances, and principle components. An iterative algorithm may be a series of ordinary square analyses. No distributional form is assumed for measured variables.

Partial Least Square Regression (PLSR) is a PLS method in which several variables are modeled simultaneously to take advantage of possible correlations between the several variables. Once a model has been generated for sample classes, the model can be used to test samples to produce a predictor value to be used to match the tested sample to one of the sample classes. For PLSR, a dependent variable may be the composite data structure constructed from the training data 114 and the independent variables may be the measurements comprising the composite data structure. For multivariate analysis, the testing application 106 may utilize PLSR to build a data agnostic predictive model to differentiate one group or several groups of data from one another.

A primary assumption in multivariate analysis is that any variation observed in the 1×N array can be attributed to information in the 1×N array. The testing application 106 may analyze data groups to be differentiated from one another through successive transformations to new orthogonal axes centered on a mean data set of the data groups with axes oriented along a direction of maximum variation of the groups. The testing application 106 applies successive transformations to both observations and responses in data sets simultaneously until a transformation is achieved in which the data groups are maximally separated.

In another example, the testing application 106 may develop the Zth data agnostic predictive model 112 using wavelet analysis. Wavelet analysis is driven by exploiting phenomenology and defect dynamics to postulate features. In contrast to multivariate analysis, features employed in wavelet analysis are easily interpretable in relation to physical phenomena. Thus, data agnostic predictive models developed using wavelet analysis easily correlate key features in the data contributing to predictions to physical phenomena. Put another way, wavelet analysis tends to accurately detect reasons for differences in data groups. Wavelet analysis is effective when the training data 114 is small and homogenous (i.e., not diverse).

For wavelet analysis, time-series data (or waveforms) measured by sensors (e.g., the digitizers referenced above) may be arranged in a P×R array (i.e., a composite data structure), where P is a number of timesteps in the time-series data and R is a number of sensors that generate measurements. The P timesteps discretize a time duration of T Thus, an entry in the P×R array is indicative of a measurement of a sensor at a given timestep.

In wavelet analysis, a time-series y(t) can be decomposed on any set of orthogonal bases, given by equation (1) below.

$$y(t) = \sum_i w_i \phi_i(t) \qquad (1)$$

Wavelets are orthogonal hierarchical bases, which are defined on a discrete set of timescales. A wavelet description of a time-series y(t) may be an average value y with details added by a linear weighted combination of bases defined on a set of levels (i.e., timescales). At level l=0, a "coarsest" detail is defined over, and is referred to as a "support" of the wavelet. At a finer level (l=1), the wavelet is defined over T/2. At l=2, the wavelet is defined by equation (2) below.

$$T/2^l = T/4 \qquad (2)$$

Since wavelets on a level must span the entire duration T, there is one wavelet at level l=0, two wavelets at level l=1, four wavelets at level l=2, and so forth.

In an embodiment, the wavelet may be a Haar wavelet. The Haar wavelet has the same shape on any level l. Haar wavelets on level l+1 are obtain by shrinking the support (by a factor of 2) and translating the support in time. Haar wavelets on a given level do not overlap, making the Haar wavelets orthogonal. Haar wavelets on adjacent levels are also orthogonal due to their shape. Decomposition of a time-series on a wavelet or a multiresolution basis is given by equation (3) below.

$$y(t) = \bar{y} + \sum_{l=0}^{L} \sum_{k=1}^{2^l} w_{l,k} \phi_{l,k}\left(t; \frac{T}{2^l}\right) \qquad (3)$$

In equation (3), $L = \lceil \log_2 P \rceil$, $w_{l,k}$ are weights of detail wavelets $\phi_{l,k}$ (t;T/2$^l$) defined on a support of T/2$^l$. Time-series from normal tests tend to have simple smooth shapes, that is, $w_{l,k}$ are very small for large l, resulting in a sparse representation of y(t), but defective tests tend to display sharp oscillations or breaks in y(t) leading to a few $w_{l,k}$ (assuming large values for large l, i.e., a signal has information or energy at finer timescales). A sum of squared weights (referred to as energy) at any level l is a coarse summary of a magnitude of the weights and takes on large values when time-series data contains sharp discontinuities. The weights $w_{l,k}$ are obtained by (1) padding the time-series y(t) so that a length of the time-series y(t) is dyadic and (2) performing a wavelet transformation. In an example, 2048 weights $w_{l,k}$ may be computed spread over levels l=0 . . . 10. A collection of wavelet weights is summarized by computing an energy of a signal at each level l (or timescale), which is given by equation (4) below.

$$E_l = \sum_{k=1}^{2^l} w_{l,k}^2 \qquad (4)$$

In an example where R=8 and weights $w_{l,k}$ are computed spread over levels l=0 . . . 10, 88 features may be obtained. In the example, a hypothesis behind a wavelet analysis-based classifier is that a difference between a normal and a defective particle source can be detected by examining features of F={$f_i$}, i=1 . . . 88. Only some of the features in F may be discriminative. In order to find a subset of features in F that are discriminative, the testing application 106 may perform a two-sided t-test. Using features vectors from a set of normal and defective particle sources, features in F are examined individually. Features values $f_i$ are draws from a normal and a defective distribution. The t-test establishes whether normal and defective distributions for features are different. The testing application 106 may use features that show a clean separation of values to make a Naïve Bayes classifier.

The plurality of data agnostic predictive models 110-112 may also include models that are developed using grammar-based analysis. The plurality of data agnostic predictive models 110-112 may be or include neural networks. Furthermore, the plurality of data agnostic predictive models 110-112 may be or include regression models and classifier models. Classifier models may be or include Naïve Bayes classifiers and/or random forest (RF) classifiers. Naïve Bayes classifiers are useful when a discriminating surface in a features space is simple (i.e., planar and aligned along axes). RF classifiers are useful when a discriminating surface in the features space is curved. RF classifiers discover features that are important in and of themselves as well as because of interactions with other features.

Operation of the computing system 100 is now set forth. The testing application 106 obtains the training data 114 for the particle sources that were generated by the particles sources as the particle sources were caused to emit particles. In an example, the particle sources may be neutron sources and as such the particles may be neutrons. With more specificity, as a particle source in the particle sources is caused to emit particles, different sensors may collect various measurements of parameters (e.g., voltage, electrical current, particle count, etc.) of the particle source over time. For instance, a voltmeter may detect a voltage of the particle source as the particle source emits the particles (i.e., voltage time-series data) and an ammeter may detect an electrical current of the particle source as the particle source emits the particles (i.e., electrical current time-series data). Measurements of the parameters are included in the training data 114. The testing application 106 generates a composite data structure based upon the training data for the particle source. The composite data structure includes all of the training data for the particle source without accommodating for different types of the parameters within the training data 114. In an example, the composite data structure may include both voltage time-series data and electrical current-time series data, each of which is not differentiated within the composite data structure.

In an embodiment, the testing application 106 performs multivariate analysis to analyze the training data 114. In the embodiment, the particle source testing application 106 generates a 1×N array (i.e., a composite data structure) based upon the training data 114, where N is a sum of a number of measurements in the training data. Each entry in the 1×N array is a measurement generated by one of the sensors. The 1×N array serves as a "signature" for the particle source. In the embodiment, the testing application 106 repeats this process for each particle source represented in the training data 114 to generate a composite data structure for each particle source.

In another embodiment, the testing application 106 performs wavelet analysis to analyze the training data 114. In the embodiment, the particle source testing application 106 generates a P×R array (i.e., a composite data structure) based upon the training data 114, where P is a number of timesteps recorded by the sensors and R is the number of sensors. Thus, an entry in the P×R array is indicative of a measurement generated by one of the sensors at a given timestep. In the embodiment, the testing application 106 repeats this process for each particle source represented in the training data 114 to generate a composite data structure for each particle source.

The testing application 106 generates (i.e., trains) at least one data agnostic predictive model based upon the composite data structures generated for each particle source represented in the training data 114. For instance, the testing application 106 may generate the first data agnostic predictive model 110 based upon first composite data structures generated for each particle source represented in the training data 114 and the testing application 106 may generate the Zth data agnostic predictive model 112 based upon second composite data structures generated for each particle source represented in the training data 114. The testing application 106 generates the at least one data agnostic predictive model without a parametric analysis of the types of variables included in the composite data structure. With more specificity, the testing application 106 may generate the at least one data agnostic predictive model without analyzing for specific parameters or performance to specific limits. After generation of the at least one data agnostic predictive model, the testing application 106 may test performance of the at least one data agnostic predictive model on the testing data 116. If the at least one data agnostic predictive model meets a performance threshold (e.g., 99% successful identification of a type of sub-optimal behavior exhibited by particle sources), the testing application 106 may include the at least one data agnostic predictive model in an automated system for detecting defects in particle sources. If the at least one data agnostic predictive model does not meet the performance threshold, the testing application 106 may iterate the training process to improve performance of the at least one data agnostic predictive model or the testing application 106 may discard the at least one data agnostic predictive model.

Subsequently, the particle source testing application 106 obtains test data for a (to-be-tested) particle source that was generated by the particle source when the particle source was caused to emit particles. Following the example above, the particle source may be a neutron source and the particles may be neutrons. The testing application 106 applies the at least one data agnostic predictive model to the test data. Similar to the process described above, the testing application 106 generates a composite data structure for the test data for the particle source (e.g., a 1×N array, a P×R array, etc.). The testing application 106 provides the composite data structure as input to the at least one data agnostic predictive model. The at least one data agnostic predictive model outputs a value based upon the input. Based upon the value, the testing application 106 outputs an indication that the particle source was operating sub-optimally when emitting the particles. For instance, when the value exceeds a threshold value, the testing application 106 may output the indication. The testing application 106 may also output an identifier for a type of sub-optimal behavior (e.g., high voltage breakdown, timing problems, etc.) exhibited by the particle source when the particle source was emitting the particles. In an embodiment, testing application 106 may cause the value and the type of sub-optimal behavior to be included in a report that is presented on a display to a user. In another embodiment, the testing application 106 may cause the particle source to be removed from manufacturing when the test data is abnormal.

In an embodiment, the particle source being tested may be a prototype particles source. In the embodiment, a design of the particle source may be modified based upon the indication output by the testing application 106 as to whether or not the particle source is exhibiting abnormal behavior.

Figure 2:
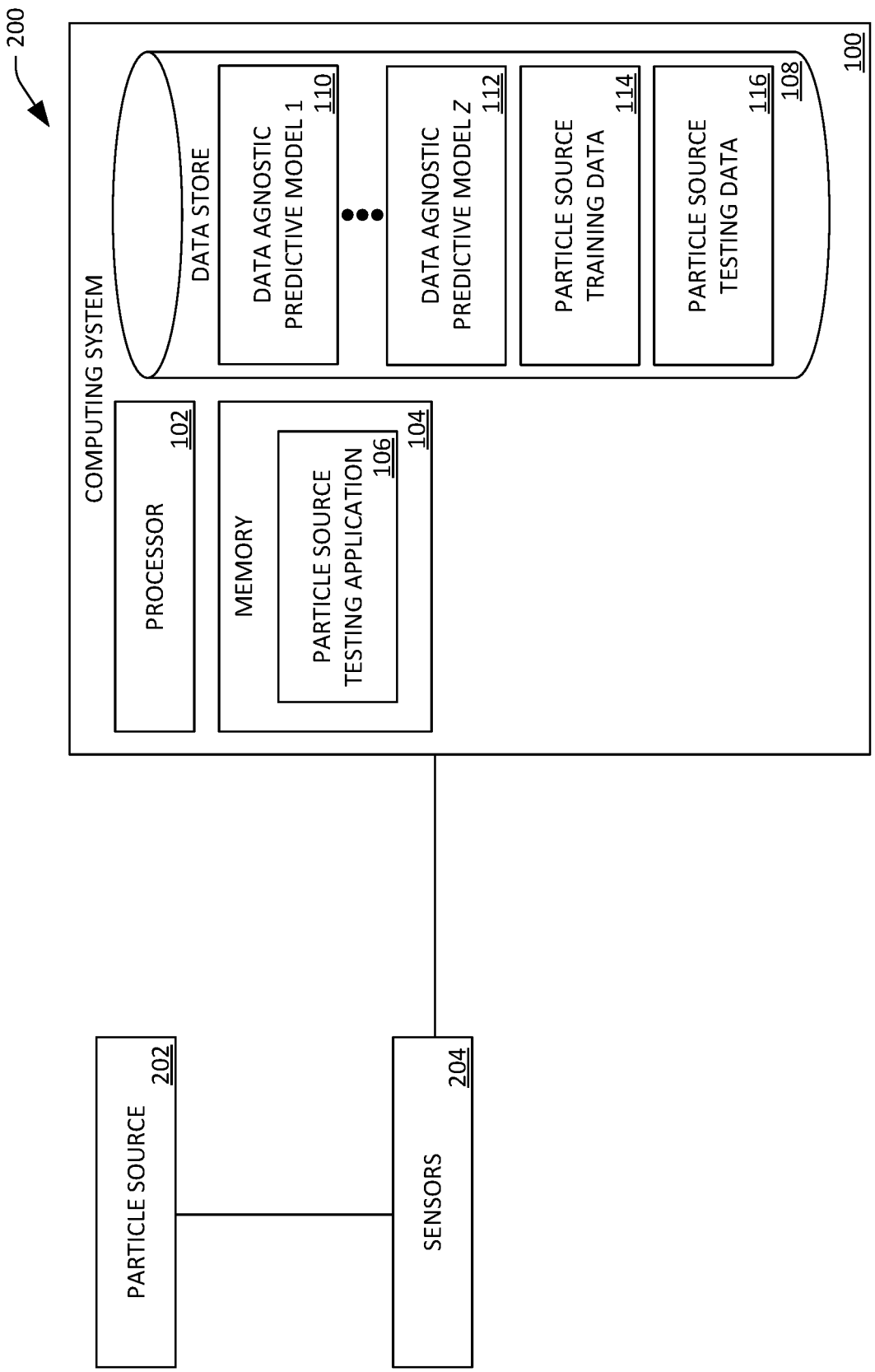
FIG. 2 is a functional block diagram of a system for automated testing of a particle source.

Referring now to FIG. 2, an exemplary system 200 that facilitates automated testing of particle sources is illustrated. In an example, the system 200 may be located in a facility that manufactures and/or designs the particle sources. The system 200 includes the computing system 100 described above in the description of FIG. 1. The system 200 additionally includes a particle source 202 that emits particles. In an example, the particle source 202 may be or include an electron source, a photon source, a neutron source, or an x-ray source. The particle source 202 may be newly manufactured (or in the process of being manufactured). The particle source may comprise a plurality of components, and operation of one or more components in the plurality of components may cause the particles source 202 to emit the particles.

The system 200 also includes sensors 204. The sensors 204 are configured to generate measurements indicative of parameters of the particle source 202 as the particle source 202 is caused to emit particles. In an example, the sensors may include one or more of a voltmeter, an ammeter, a particle counter, etc. The measurements may be or include time-series data. For instance, a sensor in the sensors 204 may generate a first measurement (e.g., a first voltage) at a first timestep, a second measurement (e.g., a second voltage) at a second time step, and so forth.

The system 200 operates in a manner similar to that set forth above in the description of FIG. 1. For instance, the particle source 202 is caused to emit particles and the sensors 204 generate test data for the particle source 202 as the particle source 202 is caused to emit the particles. The test data for the particle source 202 thus comprises measurements of different types. The testing application 106 obtains the test data for the particle source 202 and generates a composite data structure based upon the test data. The testing application 106 then applies one or more of the plurality of data agnostic predictive models 110-112 to the test data for the particle source 202. With more specificity, particle source testing application 106 generates a composite data structure based upon the test data for the particle source 202. The particle source testing application 106 inputs the composite data structure for the particle source 202 into at least one of the plurality of data agnostic predictive models 110-112. The at least one of the plurality of data agnostic predictive models 110-112 outputs a value that is indicative of whether or not the test data for the particle source 202 is abnormal. When the value indicates that the test data for the particle source 202 is abnormal, the testing application 106 may output an identifier for a type of the abnormality.

Figure 3:
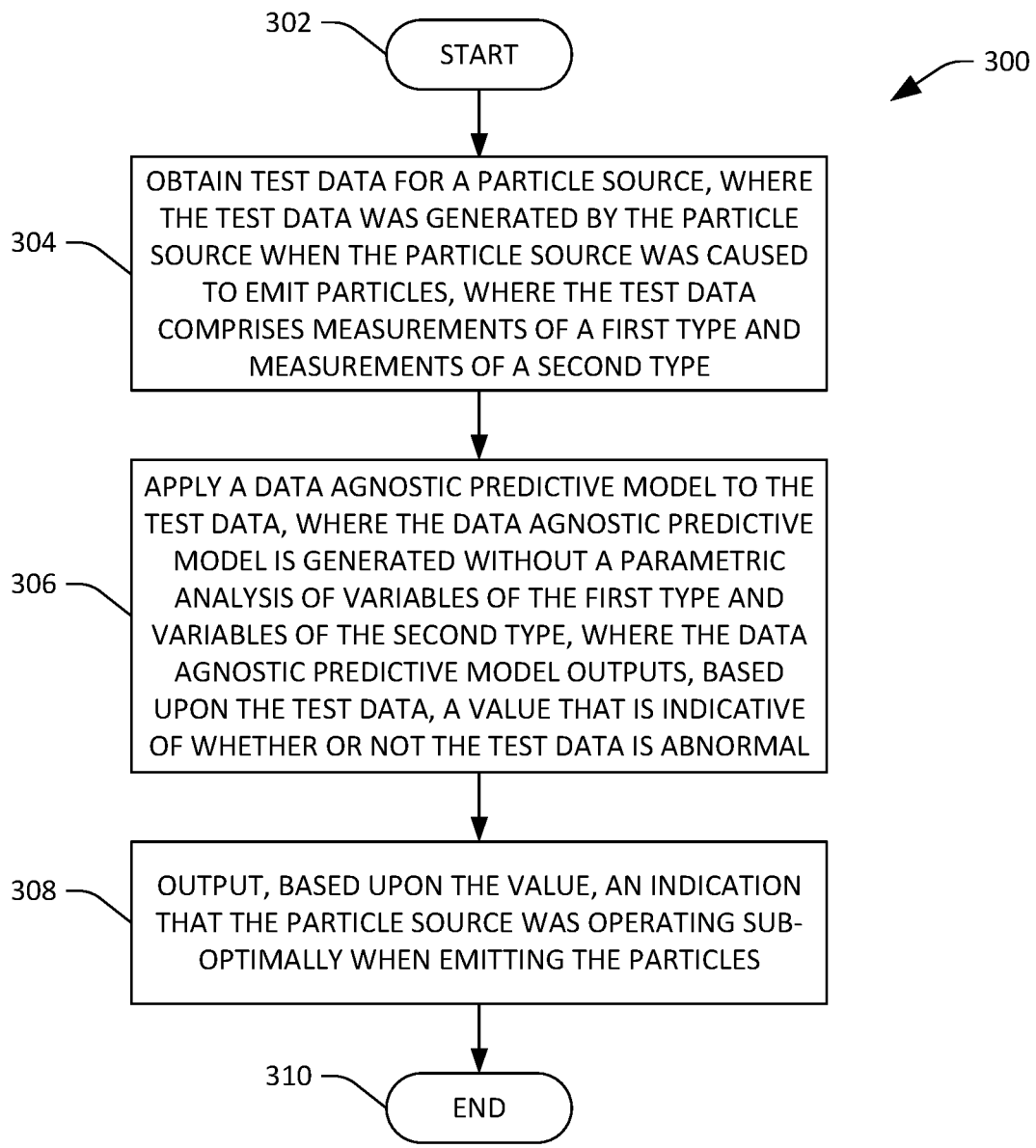
FIG. 3 is a flow diagram that illustrates an exemplary methodology for detecting abnormalities in particle source test data.
Figure 4:
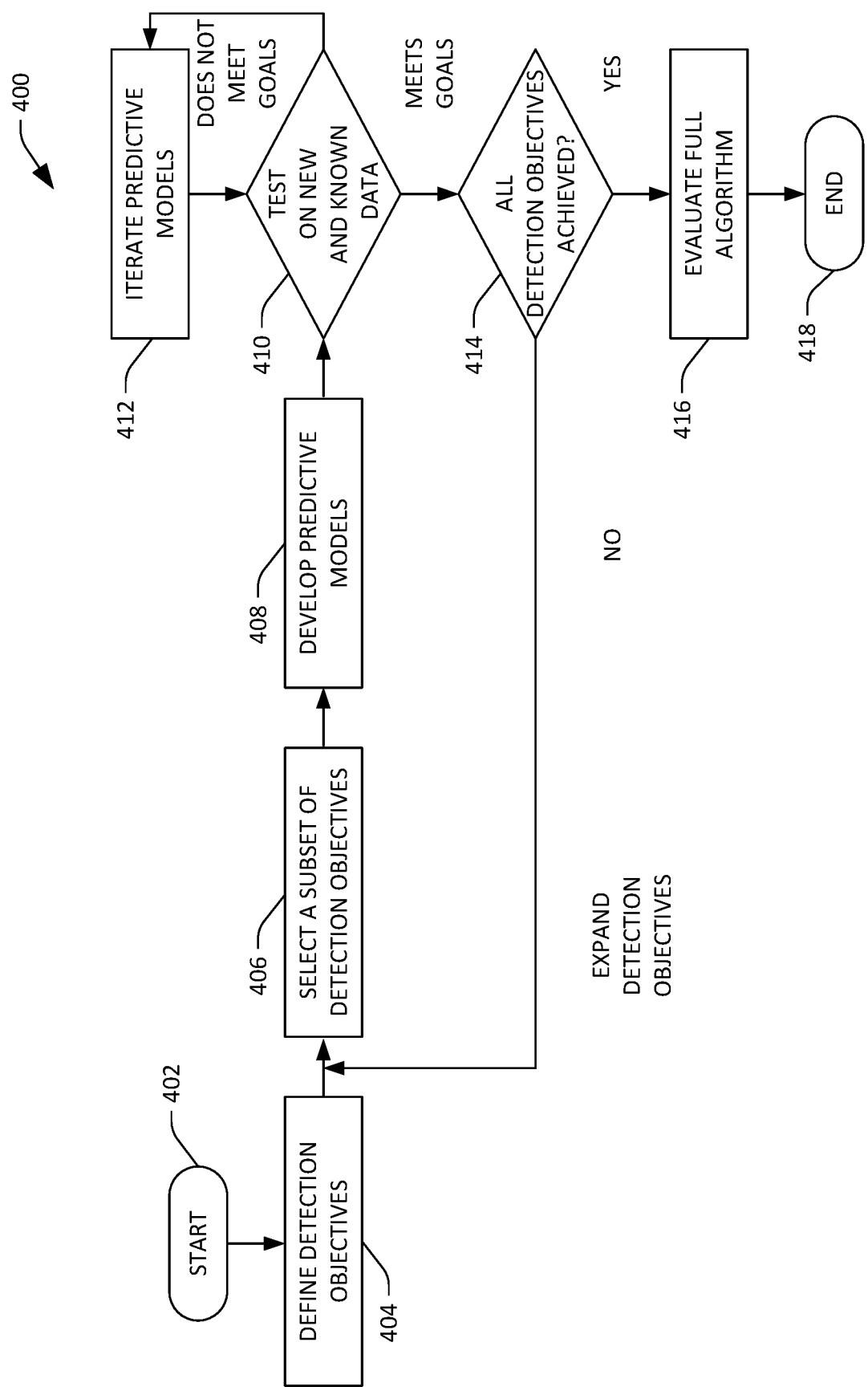
FIG. 4 is a flow diagram that illustrates an exemplary methodology for developing predictive models that detect abnormalities in particle source test data.

FIGS. 3 and 4 illustrate exemplary methodologies relating to automated testing of particle sources. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring now to FIG. 3, a methodology 300 that facilitates detecting abnormalities in test data for a particle source is illustrated. The methodology 300 begins at 302, and at 304, a computing system obtains test data for a particle source. The test data was generated by the particle source when the particle source was caused to emit particles. The test data comprises a first set of measurements of a first type and a second set of measurements of a second type. At 306, the computing system applies a data agnostic predictive model to the test data. The data agnostic predictive model is generated without a parametric analysis of variables of the first type and variables of the second type. Based upon the test data, the data agnostic predictive model outputs a value that is indicative of whether or not the test data is abnormal. At 308, based upon the value, the computing system outputs an indication that the particle source was operating sub-optimally when emitting the particles. The methodology 300 concludes at 310.

Turning now to FIG. 4, a methodology 400 that facilitates developing predictive models that detect abnormalities in test data for a particle source is illustrated. The methodology 400 begins at 402, and at 404, detection objectives are defined, wherein the detection objectives are sub-optimal behaviors that may be exhibited by the particle source when the particle source is caused to emit particles. In an example where the particle source is a neutron source, detection objectives may include detecting high voltage breakdown of the neutron source, detecting "choking" of the neutron source, and detecting failures due to delayed output of the neutron source. At 406, a subset of the detection objectives are selected. Following the example, the subset of the detection objectives may include detecting the high voltage breakdown of the neutron source. At 408, computer-implemented, data agnostic predictive models are developed that are configured to detect the detection objective. Prior to development of the data agnostic predictive models, training data may be segregated into groups typical of behaviors of interest (e.g., high voltage breakdown, normal behavior, etc.), and the predictive models may be developed based upon the segregated data. Following the example, a data agnostic predictive model may be developed using multi-variate analysis and/or wavelet analysis, where the data agnostic predictive model is configured to identify data for particles sources that is indicative of high voltage breakdown. At 410, the data agnostic predictive model is tested on new test data to evaluate performance. If the data agnostic predictive model does not meet a threshold detection goal, at 412, the data agnostic predictive model is iterated by adding new data to the training data and retraining the data agnostic predictive model in order to improve performance, or the data agnostic predictive model is discarded. If the data agnostic predictive model does meet a threshold detection goal, at 414, the data agnostic predictive model is included in an automated algorithm for screening test data for particle sources and the detection objectives are examined. Predictive models with best performance may be selected for inclusion into the algorithm, and their associated data may be removed from the training data used to train data agnostic predictive models. If all detection objectives have not been achieved, a different subset of detection objectives is selected again at 406, and predictive models are developed for the subset. If all detection objectives have been achieved, at 416, performance of the automated algorithm is evaluated. Automated data pull, data preprocessing, and algorithm implementation code are developed in parallel with development of the data agnostic predictive models. The methodology 400 concludes at 418.

Figure 5:
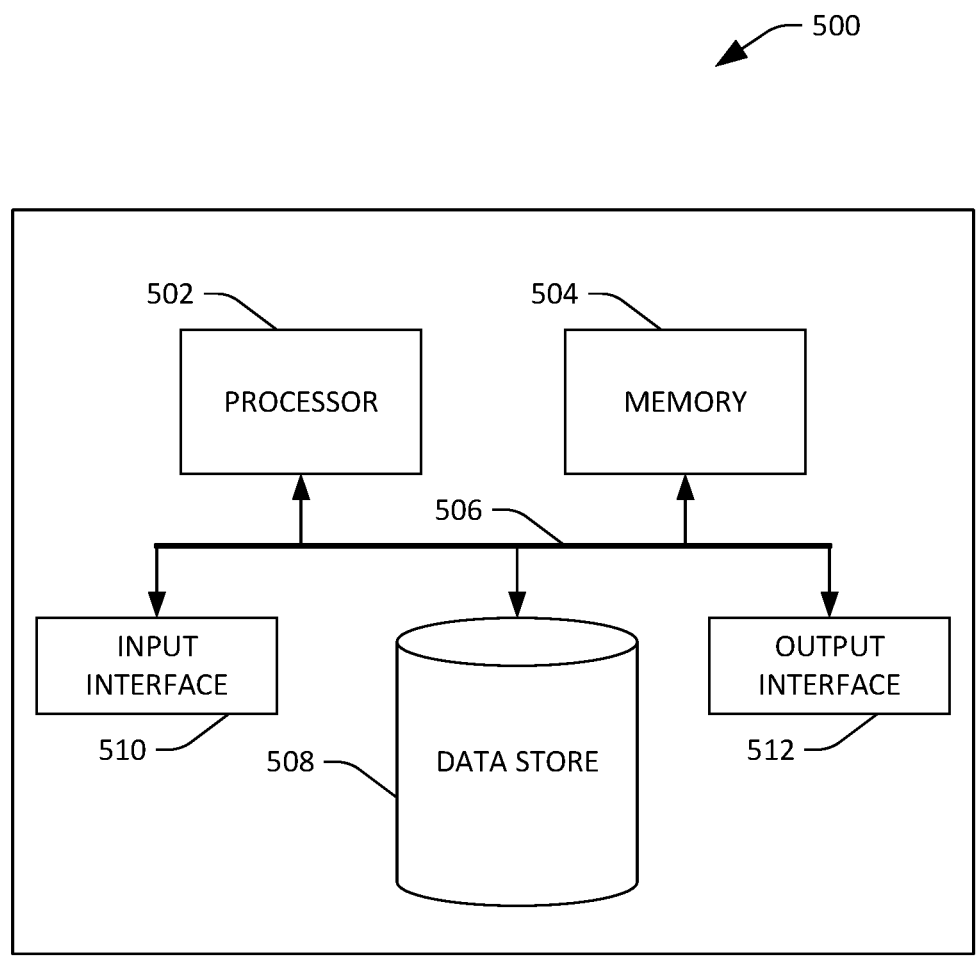
FIG. 5 is an exemplary computing device.

Referring now to FIG. 5, a high-level illustration of an exemplary computing device 500 that can be used in accordance with the systems and methodologies disclosed herein is illustrated. For instance, the computing device 500 may be used in a system that generates data agnostic predictive models. By way of another example, the computing device 500 can be used in a system that screens test data for particle sources. The computing device 500 includes at least one processor 502 that executes instructions that are stored in a memory 504. The instructions may be, for instance, instructions for implementing functionality described as being carried out by one or more components discussed above or instructions for implementing one or more of the methods described above. The processor 502 may access the memory 504 by way of a system bus 506. In addition to storing executable instructions, the memory 504 may also store training data for particle sources, test data for particle sources, data agnostic predictive models, composite data structures, etc.

The computing device 500 additionally includes a data store 508 that is accessible by the processor 502 by way of the system bus 506. The data store 508 may include executable instructions, training data for particle sources, test data for particle sources, data agnostic predictive models, composite data structures, etc. The computing device 500 also includes an input interface 510 that allows external devices to communicate with the computing device 500. For instance, the input interface 510 may be used to receive instructions from an external computer device, from a user, etc. The computing device 500 also includes an output interface 512 that interfaces the computing device 500 with one or more external devices. For example, the computing device 500 may display text, images, etc., by way of the output interface 512.

It is contemplated that the external devices that communicate with the computing device 500 via the input interface 510 and the output interface 512 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 500 in a manner free from constraints imposed by input devices such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 500 may be a distributed system. Thus, for instance, several devices may be in communication by way of a network connection and may collectively perform tasks described as being performed by the computing device 500.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise random-access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functions described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A computing system, comprising:
    a processor; and
    memory storing instructions that, when executed by the processor, cause the processor to perform acts comprising:
        obtaining test data for a particle source, wherein the test data is associated with the particle source when the particle source was caused to emit particles, wherein the test data comprises a first set of measurements of a first type and a second set of measurements of a second type, wherein the first set of measurements of the first type comprises voltage data of the particle source as the particle source is caused to emit the particles, and further wherein the second set of measurements of the second type comprises electrical current data of the particle source as the particle source is caused to emit the particles;
        applying a data agnostic predictive model to the test data, wherein the data agnostic predictive model is generated without a parametric analysis of variables of the first type and variables of the second type, wherein the data agnostic predictive model outputs, based upon the test data, a value that is indicative of whether or not the test data is abnormal; and
        based upon the value, outputting an indication that the particle source was operating sub-optimally when emitting the particles.

2. The computing system of claim 1, wherein the particle source is one of:

an electron source;
a photon source;
a neutron source; or
an x-ray source.

3. The computing system of claim 1, wherein the acts of obtaining, applying, and outputting occur during a manufacturing process of the particle source.

4. The computing system of claim 1, wherein the data agnostic predictive model comprises:
a first model generated based upon a multivariate analysis; and
a second model generated based upon a wavelet analysis.

5. The computing system of claim 1, the acts further comprising:
when the value indicates that the test data is abnormal, identifying a type of sub-optimal behavior exhibited by the particle source as the particle source was caused to emit the particles; and
outputting an identifier for the type of sub-optimal behavior.

6. The computing system of claim 1, wherein applying the data agnostic predictive model to the test data comprises generating a composite data structure based upon the test data, wherein the first set of measurements of the first type and the second set of measurements of the second type are not differentiated within the composite data structure, wherein the composite data structure is provided as input to the data agnostic predictive model, thereby causing the data agnostic predictive model to output the value.

7. The computing system of claim 1, wherein applying the data agnostic predictive model to the test data does not entail comparing the first set of measurements of the first type to a first threshold value of the first type, wherein applying the data agnostic predictive model to the test data does not entail comparing the second set of measurements of the second type to a second threshold value of the second type.

8. The computing system of claim 1, wherein the particle source comprises a plurality of components, wherein operation of a component in the plurality of components when the particle source emits the particles results in the test data for the particle source being generated.

9. A method performed by a processor for evaluating test data of a particle source, the method comprising:
obtaining test data for a particle source, wherein the test data was generated by sensors associated with the particle source when the particle source was caused to emit particles, wherein the test data comprises:
a first set of measurements of a first type, wherein the first set of measurements of the first type comprises voltage data of the particle source as the particle source is caused to emit the particles; and
a second set of measurements of a second type, wherein the second set of measurements of the second type comprises electrical current data of the particle source as the particle source is caused to emit the particles;
applying a data agnostic predictive model to the test data, wherein the data agnostic predictive model is generated without a parametric analysis of variables of the first type and variables of the second type, wherein the data agnostic predictive model outputs, based upon the test data, a value that is indicative of whether or not the test data is abnormal; and
outputting, based upon the value, an indication that the particle source was operating sub-optimally when emitting the particles.

10. The method of claim 9, further comprising:
when the value indicates that the test data is abnormal, outputting an identifier for a type of sub-optimal behavior exhibited by the particle source when the particle source was caused to emit the particles.

11. The method of claim 9, further comprising:
prior to obtaining the test data, generating the data agnostic predictive model based upon training data, wherein the training data was generated by a plurality of particle sources when each of the plurality of particle sources were caused to emit respective particles.

12. The method of claim 11, wherein the training data comprises first sets of measurements of the first type and second sets of measurements of the second type.

13. The method of claim 9, wherein the first set of measurements of the first type comprises first time-series data, wherein the second set of measurements of the second type comprises second time-series data.

14. The method of claim 9, wherein the indication indicates that particle source was exhibiting sub-optimal behavior when the value exceeds a threshold value.

15. The method of claim 9, wherein the data agnostic predictive model is configured to detect a sub-optimal behavior exhibited by the particle source as the particle source was caused to emit the particles, the method further comprising:
applying a second data agnostic predictive model to the test data, wherein the second data agnostic predictive model is configured to detect a second sub-optimal behavior exhibited by the particle source as the particle source was caused to emit the particles, wherein the second data agnostic predictive model is generated without the parametric analysis of the variables of the first type and the variables of the second type, wherein the second data agnostic predictive model outputs, based upon the test data, a second value that is indicative of whether or not the test data is abnormal; and
outputting, based upon the second value, an indication that the particle source was operating sub-optimally when emitting the particles.

16. The method of claim 9, wherein the data agnostic predictive model is included in a plurality of predictive models that are configured to detect sub-optimal behavior exhibited by the particle source as the particle source is caused to emit the particles.

17. The method of claim 9, wherein the particles include at least one of:
electrons;
protons;
neutrons; or
x-ray particles.

18. The method of claim 9, wherein the particle source is a prototype particle source, wherein a design of the prototype particle source is modified based upon the indication.

19. A system, comprising:
a particle source that is configured to emit particles;
a sensor that is configured to generate test data of the particle source when the particle source is caused to emit particles, wherein the test data comprises:
a first set of measurements of a first type, wherein the first set of measurements of the first type comprises voltage data of the particle source as the particle source is caused to emit the particles; and
a second set of measurements of a second type, wherein the second set of measurements of the second type comprises electrical current data of the particle source as the particle source is caused to emit the particles; and a computing system that is configured to:
  obtain the test data for the particle source;
  apply a data agnostic predictive model to the test data, wherein the data agnostic predictive model is generated without a parametric analysis of variables of the first type and variables of the second type, wherein the data agnostic predictive model outputs, based upon the test data, a value that is indicative of whether or not the test data is abnormal; and
  output an indication that the particle source was functioning sub-optimally when emitting the particles based upon the value.

20. The system of claim 19, wherein the value indicates that the test data is abnormal, and further wherein the computing system is also configured to output an identifier for a type of sub-optimal behavior exhibited by the particle source when the particle source was caused to emit the particles.

* * * * *